(12) United States Patent
Zhao et al.

(10) Patent No.: US 12,476,220 B2
(45) Date of Patent: Nov. 18, 2025

(54) SUBSTRATE-BASED PACKAGE SEMICONDUCTOR DEVICE WITH SIDE WETTABLE FLANKS

(71) Applicant: NEXPERIA B.V., Nijmegen (NL)

(72) Inventors: YuJun Zhao, Nijmegen (NL); JinXin Yi, Nijmegen (NL); Yuan Li, Nijmegen (NL); Frank Burmeister, Nijmegen (NL); Jennifer Schuett, Nijmegen (NL); Dicky Tirta Djaja, Nijmegen (NL); Qingyuan Tang, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 554 days.

(21) Appl. No.: 17/989,897

(22) Filed: Nov. 18, 2022

(65) Prior Publication Data
US 2023/0154891 A1     May 18, 2023

(30) Foreign Application Priority Data

Nov. 18, 2021   (EP) .................... 21208944

(51) Int. Cl.
*H01L 21/78*   (2006.01)
*H01L 23/00*   (2006.01)
*H01L 23/498*  (2006.01)

(52) U.S. Cl.
CPC .............. *H01L 24/97* (2013.01); *H01L 21/78* (2013.01); *H01L 23/49822* (2013.01);
(Continued)

(58) Field of Classification Search
CPC ... H01L 24/97; H01L 21/78; H01L 23/49822; H01L 24/16; H01L 24/48; H01L 2224/16227; H01L 2224/48227; H01L 2224/97; H01L 23/145; H01L 23/3121; H01L 24/81; H01L 24/95; H01L 2224/32225; H01L 21/561; H01L 23/49827; H01L 2224/95; H01L 23/49805; H01L 23/48; H01L 21/50; H01L 21/60; H01L 23/32
See application file for complete search history.

(56) References Cited

U.S. PATENT DOCUMENTS

| 2019/0363039 A1 | 11/2019 | Appelt et al. |
| 2021/0098355 A1 | 4/2021 | Del Sarto et al. |

FOREIGN PATENT DOCUMENTS

EP    3176818 A1    6/2017

OTHER PUBLICATIONS

Extended European Search Report for corresponding European application EP21208944.5 8 pages dated May 11, 2022.

*Primary Examiner* — Elias Ullah
(74) *Attorney, Agent, or Firm* — Ruggiero McAllister & McMahon LLC (57) ABSTRACT

A substrate-based package semiconductor device is provided. The present disclosure further relates to a carrier including a plurality of non-singulated substrate-based package semiconductor devices and to a method of manufacturing the same. In embodiments in accordance with the present disclosure, the lowest insulating layer(s) has/have cavities arranged near and associated with one or more package terminals, and an inner wall of the cavities is covered with a conductive body that connects to the respective associated package terminal. Furthermore, the non-singulated substrate-based package semiconductor devices are separated by a separating region of the substrate, and the cavities are at least partially formed in the separating region.

18 Claims, 5 Drawing Sheets

(52) U.S. Cl.
CPC .............. *H01L 24/16* (2013.01); *H01L 24/48* (2013.01); *H01L 2224/16227* (2013.01); *H01L 2224/48227* (2013.01); *H01L 2224/97* (2013.01)

SUBSTRATE-BASED PACKAGE SEMICONDUCTOR DEVICE WITH SIDE WETTABLE FLANKS

CROSS REFERENCE TO RELATED APPLICATION

This application claims the benefit under 35 U.S.C. § 119(a) of European Application No. 21208944.5 filed Nov. 18, 2021, the contents of which are incorporated by reference herein in their entirety.

BACKGROUND OF THE DISCLOSURE

1. Field of the Disclosure

Aspects of the present disclosure relate to a substrate-based package semiconductor device. The present disclosure further relates to a carrier comprising a plurality of non-singulated substrate-based package semiconductor devices and to a method of manufacturing the same.

2. Description of the Related Art

For all applications that require excellent radiofrequency, RF, performance like high-speed data communication or high-speed switching, semiconductor devices with ultra-low capacitance and inductance are essential. In contrast to traditional leadframe based packages, substrate-based packages using an organic laminate substrate like Land Grid Array, LGA, packages or packages using a (pre-) molded substrate, offer low parasitics and can satisfy this key requirement. This can be achieved with an optimized substrate top layer and/or substrate internal redistribution layer layout, for example by avoiding any overlap between metal layers that are not electrically connected and thus having the same electric potential.

Substrate-based package semiconductor devices are known in the art. These packages include a substrate that comprises one or more insulating layers. The substrate has an upper surface, a lower surface, and a plurality of side surfaces. A top metal layer is provided on the upper surface, and a bottom metal layer is provided on the lower surface. Depending on the number of insulating layers, the substrate may be provided with one or more inner metal layers.

Known substrate-based package semiconductor devices further comprise a semiconductor die on which an electric component or circuit is integrated. The electronic component or circuit has one or more die terminals, and the semiconductor die is mounted on the upper surface of the substrate. Furthermore, known substrate-based package semiconductor devices comprise one or more package terminals that are at least partially formed using the lower metal layer. These package terminals are electrically connected to the one or more die terminals. Generally, the device further comprises a body of solidified molding compound covering the upper surface of the substrate and encapsulating the semiconductor die.

Substrate-based package semiconductor devices are configured for being mounted with their lower surface on a further substrate or carrier, such as a printed circuit board. More in particular, the package terminals are connected, using solder, a conductive glue, or the like, with corresponding terminals or pads on the further substrate or carrier.

The substrate used in substrate-based package semiconductor devices is used for manufacturing a plurality of substrate-based package semiconductor devices in a substantially simultaneous manner. More in particular, substantially all steps for forming the devices are performed when the devices are still attached to each other through the substrate. As a final step, the devices are singulated by e.g. punching, cutting, or sawing the substrate.

The quality of the electrical contact between the package terminals of the substrate-based package semiconductor device and the corresponding terminals on the further substrate or carrier is of key importance for the electrical characteristics and reliability of the final product. To verify the quality of the electrical contact, visual inspection techniques are used in which one or more cameras record images of the device after placement.

The Applicant has found that the quality of the electrical contacts of existing substrate-based package semiconductor devices and/or the way in which the reliability or quality of these contacts can be verified is not always satisfactory.

SUMMARY

At least some of the embodiments in accordance with a first aspect of the present disclosure provide a substrate-based package semiconductor device in which the above-mentioned problems do not occur or at least to a lesser extent.

According to an aspect of the present disclosure, a carrier is used that comprises a plurality of non-singulated substrate-based package semiconductor devices wherein the lowest insulating layer(s) among the one or more insulating layers has/have cavities arranged near and associated with the one or more package terminals of the plurality of non-singulated substrate-based package semiconductor devices, wherein an inner wall of the cavities is covered with a conductive body that connects to the respective associated package terminal, wherein the non-singulated substrate-based package semiconductor devices are separated by a separating region of the substrate, wherein the cavities are at least partially formed in the separating region.

The non-singulated substrate-based package semiconductor devices are preferably identical allowing substantially simultaneous fabrication thereof.

The lowest insulating layer(s) comprise(s) the insulating layer of which a surface forms or is arranged nearest to the lower surface of the substrate, and the n insulating layers that are sequentially arranged next to that insulating layer, wherein n=0, 1, 2, 3 . . . . For example, if a substrate comprises five insulating layers that are numbered in the order in which they are arranged relative to each other with the first insulating layer corresponding to the insulating layer arranged nearest to the lower surface of the substrate, the three lowest insulating layers would be the first, second, and third insulating layer.

The substrate-based package semiconductor devices that are obtained from the carrier describe above after singulation provide an exposed wettable side surface or wettable flank surface that improves the board-level reliability and mechanical robustness by facilitating stronger solder joints. In addition, it enables a fully automatic visual inspection post-assembly required by the automotive industry.

The separating region may correspond to a region of the substrate that is removed and/or destroyed during the process of singulation. As a result of the singulation, the cavities are exposed to the outside causing the inner wall and the conductive body arranged thereon to function as a wettable side surface of wettable flank surface of the device.

Each cavity of a given non-singulated substrate-based package semiconductor device may, together with a cavity of an adjacent non-singulated substrate-based package semiconductor device, form a contiguous cavity. This contiguous cavity may extend fully through the separating region, at least in one direction. Additionally, the carrier is preferably configured to be cut, sawn, punched, or otherwise subjected to a severing action, along a plurality of singulation lines for the purpose of singulating the plurality of non-singulated substrate-based package semiconductor devices, wherein center points of the contiguous cavities are aligned with the singulation lines. During singulation, bar like segments of the carrier will be removed as part of the singulation action. For example, when a sawing action is performed, the bar like segment will largely correspond to the width of the sawing blade used.

The cavities may extend fully through the lowest insulating layer(s). Furthermore, the lowest insulating layers may include all insulating layer(s). In this latter case, the substrate may comprise a plurality of insulating layers, wherein the cavities extend through each of the plurality of insulating layers.

Each package terminal can be associated with a respective cavity, and each cavity can be provided with a conductive body that connects to the package terminal that cavity is associated with. In this manner, it is ensured that when electrical contact is made with the conductive body, e.g. using solder, electrical contact is also made with the corresponding package terminal.

The conductive body in a cavity of a given non-singulated substrate-based package semiconductor device may form, together with the conductive body in a cavity of an adjacent non-singulated substrate-based package semiconductor device, a contiguous conductive body. Typically, the conductive bodies of the non-singulated substrate-based package semiconductor devices are simultaneously deposited, grown, or otherwise formed.

The conductive bodies may comprise one or more metal layers. Furthermore, the conductive bodies may further comprise a solderable conductive material arranged on the one or more metal layers, wherein the solderable conductive material is preferably a material chosen from the group consisting of Ag, Bi, Cu, In, Sb, Sn, Pb, Zn, or a combination thereof. The conductive material used for filling the cavity comes typically in powder or paste form and is mostly cured after the filling process.

The carrier may further comprise a body of solidified molding compound covering the upper surface of the substrate and encapsulating the semiconductor dies. This molding compound forms an upper side of the device and partially forms the side surfaces of the device.

The carrier may further comprise an upper metal layer arranged on the upper surface of the substrate, wherein the upper metal layer at least partially forms inner terminals that are connected to the die terminals of the plurality of non-singulated substrate-based package semiconductor devices. The inner terminals are electrically connected to the package terminals, preferably through the conductive bodies arranged on the inner walls of the cavities. However, embodiments are also possible in which the inner terminals are connected using one or more vias to the package terminals instead of through the conductive bodies. However, also in these situations, the inner terminals are electrically connected to the conductive bodies, namely through the package terminals.

The substrate may comprise a plurality of insulating layers and one or more inner metal layers arranged in between adjacent insulating layers. In this case, the conductive bodies arranged on the inner walls of the cavities connect to and/or are partially formed by the one or more inner metal layers that is/are arranged in between the most upper insulating layer of said lowest insulating layer(s) and the insulating layer arranged above said most upper insulating layer. Moreover, the one or more inner metal layers can be electrically connected to the inner terminals using one or more vias through the insulating layers among the one or more insulating layers other than the lowest insulating layer(s).

The semiconductor dies can be flip-chipped on the upper surface, wire bonded, using bondwires, to the upper surface, or the semiconductor dies can be mounted to the upper surface using clip or ribbon bonding.

The non-singulated substrate-based package semiconductor devices may comprise further package terminals that are at least partially formed using the lower metal layer and that are arranged spaced apart from the cavities. These further package terminals may also be electrically connected to a respective die terminal, for example through one or more vias extending through the one or more insulating layers. For example, the package terminals may be arranged around a perimeter of the device and one or more further package terminal may be arranged in between these package terminals. This/these further package terminal(s) may constitute a ground terminal and may be connected to one or more die terminals that each provide a ground reference signal to the semiconductor die.

The carrier may further comprise a first solder mask that is arranged on the upper surface and that comprises openings exposing the inner terminals. Additionally or alternatively, the carrier may further comprise a second solder mask that is arranged on the lower surface and that comprises openings exposing the package terminals and the further package terminals when applicable. Instead of using the first and/or second solder mask, an organic solderability preservative can be sprayed or otherwise arranged on the upper and/or lower surface of the substrate. Typically, organic solderability preservatives use a water-based organic compound that selectively bonds to copper and protects the copper until soldering.

The one or more insulating layers may comprise layers made of a material chosen from the group consisting of fiber-reinforced epoxy/polymer, polyester, polyimide, polytetrafluorethylene, polyamide, liquid crystal polymers, and ceramics such as $Al_2O_3$, AlN, BeO, glass, or a mixture thereof.

At least some of the embodiments in accordance with a second aspect of the present disclosure provide a substrate-based package semiconductor device that is obtained by singulating the substrate-based package semiconductor devices from the abovementioned carrier. For example, the substrate-based package semiconductor device may have been obtained by performing sawing, punching, cutting, or by performing another severing action, on the carrier as defined above along the plurality of singulation lines.

The lowest insulating layer(s) among the one or more insulating layers may have cutout regions in side surface(s) of the substrate arranged near and associated with the one or more package terminals. The cutout regions corresponding to the cavities have been formed as a result of performing the singulation, wherein an inner wall of the cutout regions is covered with the conductive body that connects to the respective associated package terminal.

At least some of the embodiments in accordance with a third aspect of the present disclosure provide a substrate-based package semiconductor device, comprising a substrate that comprises one or more insulating layers and that has an upper surface, a lower surface, a plurality of side surfaces, and a lower metal layer arranged on the lower surface. The substrate-based package semiconductor device is configured for being mounted with its lower surface on a further substrate or carrier, such as a printed circuit board.

The substrate-based package semiconductor device further comprises a semiconductor die on which an electric component or circuit is integrated, said electronic component or circuit having one or more die terminals. The semiconductor die is mounted on the upper surface of the substrate.

The substrate-based package semiconductor device further comprises one or more package terminals that are at least partially formed using the lower metal layer, wherein the one or more package terminals are electrically connected to the one or more die terminals.

The lowest insulating layer(s) among the one or more insulating layers has/have cutout regions in the side surface (s) arranged near and associated with the one or more package terminals, wherein an inner wall of the cutout regions is covered with a conductive body that connects to the respective associated package terminal.

An method in accordance with a fourth aspect of the present disclosure comprises a method of manufacturing a carrier as defined above. This method comprises the step of providing a substrate comprising one or more insulating layers and having an upper surface, a lower surface, and a lower metal layer arranged on the lower surface, wherein the lower metal layer at least partially forms one or more package terminals.

The method additionally comprises the steps of forming a plurality of cavities, holes, or recesses at a plurality of singulation lines on the lower surface of the substrate and covering an inner wall of the formed cavities with a conductive body that connects to the one or more package terminals.

The method further comprises the step of arranging a semiconductor die on which an electric component or circuit is integrated on the upper surface of the substrate, wherein the electronic component or circuit has one or more die terminals that are connected to the package terminals.

The method may further comprise performing sawing, punching, cutting, or by performing another severing action for singulating the substrate-based package semiconductor devices by separating the substrate-based package semiconductor devices in accordance with the singulation lines.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

DETAILED DESCRIPTION

Figure 1A:
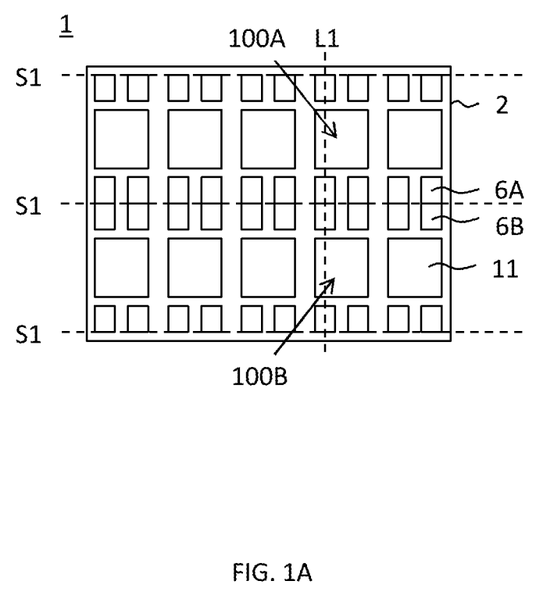
FIG. 1A indicates an embodiment of a carrier in accordance with an aspect of the present disclosure, and FIGS. 1B and 1C different corresponding cross-sectional views.

FIG. 1A indicates an embodiment of a carrier 1 in accordance with an aspect of the present disclosure. It comprises a plurality of non-singulated substrate-based package semiconductor devices 100A, 100B, which are illustrated in more detail in FIG. 1B. FIG. 1C illustrates a substrate-based package semiconductor device 100 after singulation. It should be noted that devices 100, 100A, and 100B are substantially identical.

FIG. 1A illustrates singulation lines S1 along which carrier 1 is to be singulated. It further illustrates a line L1 corresponding to the cross-sectional view of FIG. 1B.

Figure 1B:
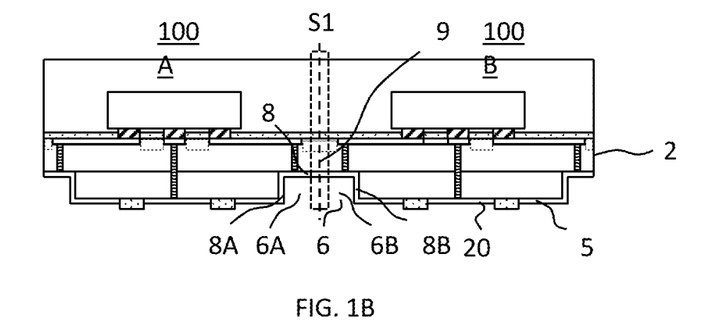
Figure 1C:
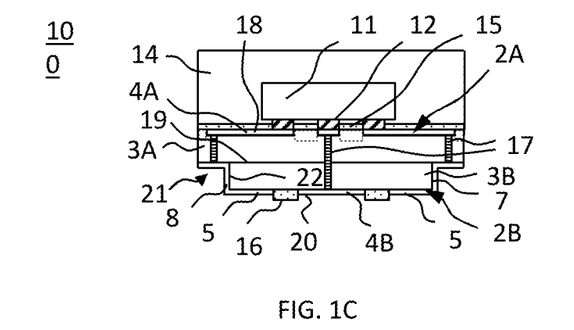

Now referring to FIGS. 1B and 1C, carrier 1 comprises a substrate 2 having an upper surface 2A and a lower surface 2B. Substrate 2 comprises an insulating layer 3A and an insulating layer 3B. A metal layer 4A is arranged on upper surface 2A. Similarly, a metal layer 4B is arranged on lower surface 2B. A further metal layer (not shown) may be arranged in between insulating layers 3A, 3B at the position indicated by reference sign 19. Metal layers 4A, 4B and the further metal layer when applicable are used for forming traces and pads.

Substrate-based package semiconductor devices 100A, 100B each comprise a semiconductor die 11 on which an electric component or circuit is integrated. This electronic component or circuit has one or more die terminals 12. Each die terminal 12 is mounted on a part of a metal trace or pad formed using metal layer 4A. Such trace or pad is referred to as inner terminal 18.

Each substrate-based package semiconductor devices 100A, 100B comprises one or more package terminals 5 that are at least partially formed using metal layer 4B. The package terminals 5 are connected to die terminals 12 using vias 17.

Substrate-based package semiconductor devices 100A, 100B are separated by a separating region 9. Typically, a center of separating region 9 coincides with a singulation line. Furthermore, each substrate-based package semiconductor device 100A, 100B comprises a cavity 6A, 6B, which in FIG. 1B are part of a single cavity 6. An inner wall 7 of cavities 6A, 6B is covered with a conductive body 8A, 8B that connects to the respective associated package terminal 5. As shown in FIG. 1B, conductive bodies 8A, 8B are part of a single conductive body 8. Conductive bodies 8, 8A, 8B comprise one or more metal layers. For example, conductive bodies 8, 8A, 8B may comprise a part of metal layer 4B. In addition, as will be explained in connection with FIG. 4, conductive bodies 8, 8A, 8B may comprise a solderable conductive material 8C arranged on the one or more metal layers, wherein the solderable conductive material 8C is a material chosen from the group consisting of Ag, Bi, Cu, In, Sb, Sn, Pb, Zn, or a combination thereof.

A first solder mask 15 covers upper surface 2A except near positions at which die terminals 12 of semiconductor die 11 contact inner terminals 18. Furthermore, a solidified molding compound 14 encapsulates semiconductor die 11 and covers upper surface 2A. A second solder mask 16 covers lower surface 2B except near positions at which package terminals 5 are to be exposed.

Package terminals 5 are arranged at the perimeter of lower surface 2B. Substrate-based package semiconductor devices 100A, 100B shown in FIG. 1B further comprise a further package terminal 20 that is at least partially formed using metal layer 4B and that is arranged spaced apart from cavities 6, 6A, 6B. More in particular, further package terminal 20 is typically electrically isolated from other package terminals 5. Further package terminal 20 may be connected using a via 17 and inner terminal 18 to a die terminal 12. For example, further package terminal 20 can be configured to be grounded during operation. It should be noted that in other embodiments of a substrate-based package semiconductor devices in accordance with the present disclosure, the further package terminal is absent.

After singulation, substrate-based package semiconductor device 100 as shown in FIG. 1C is obtained. By singulation along singulation lines S1, a cutout region 21 is formed inside surface 22 of substrate 2 that corresponds to cavity 6.

When mounting substrate-based package semiconductor device 100 on a further carrier or substrate, such as a printed circuit board, package terminals 5 and further package terminal 20 when applicable are facing towards the printed circuit board. Solder, adhesive glue or the like is used for connecting substrate-based package semiconductor device 100 to the printed circuit board. An advantage of at least some of the embodiments in accordance with the present disclosure is that the solder or conductive glue can also attach to conductive body 8. More in particular, conductive body 8 forms a conductive surface to which the solder or conductive glue adheres. In this manner, the side flanks of substrate-based package semiconductor device 100 are referred to as being wettable.

If solder or conductive glue adheres to both package terminal 5 and conductive body 8, a more reliable electrical contact can be obtained. Moreover, by visually inspecting the solder or conductive glue on conductive body 8, the quality or reliability of the electrical contact between device 100 and the printed circuit board can be determined or estimated.

Figure 2A:
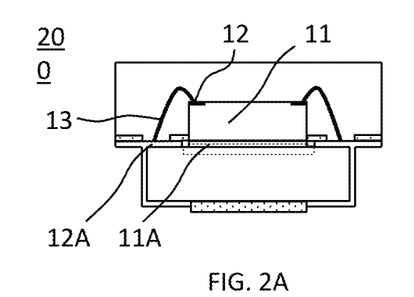
FIGS. 2A and 2B illustrate different embodiments of a substrate-based package semiconductor device according to an aspect of the present disclosure.
Figure 2B:
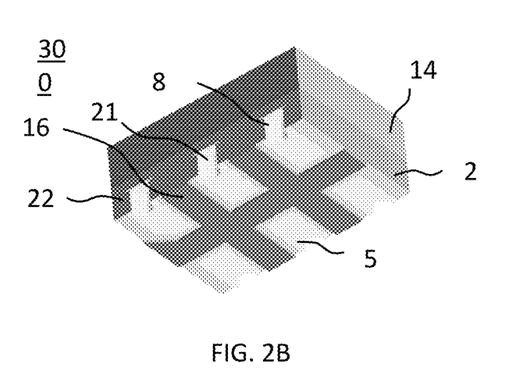

FIGS. 2A and 2B illustrate different embodiments of a substrate-based package semiconductor device according to an aspect the present disclosure.

In FIG. 2A, substrate-based package semiconductor device 200 comprises a semiconductor die 11 that is wire bonded to upper surface 2A of substrate 2. To this end, a die pad 11A may be formed on upper surface 2A using metal layer 4A. The component or electronic circuitry has die terminals 12 formed on an upper surface of semiconductor die 11. Die terminals 12 are connected to bondpads 12A formed using metal layer 4A using bondwires 13.

In some embodiments (not shown), semiconductor die 11 has a backside metallization by which it is connected to die pad 11A. Moreover, in some embodiments, the substrate of semiconductor die 11 is conductive or it is provided with one or more vias connecting the backside metallization to the component or circuitry integrated on semiconductor die 11. In some embodiments, the backside metallization is used for providing a ground signal to the component or circuitry of the semiconductor die 11. Similar to the embodiment in FIG. 1C, a via 17 can be used to connect the die pad to a further package terminal.

FIG. 2B illustrates a substrate-based package semiconductor device 300 that comprises a substrate having multiple insulating layers. As shown, side surface 22 comprises cutout regions 21 of which an inner wall is covered by a conductive body 8, which is physically and electrically connected to a package terminal 5 formed at the lower surface of device 300. A solder mask 16 prevents short-circuits between the various terminals 5 when mounting device 300.

Figure 3:
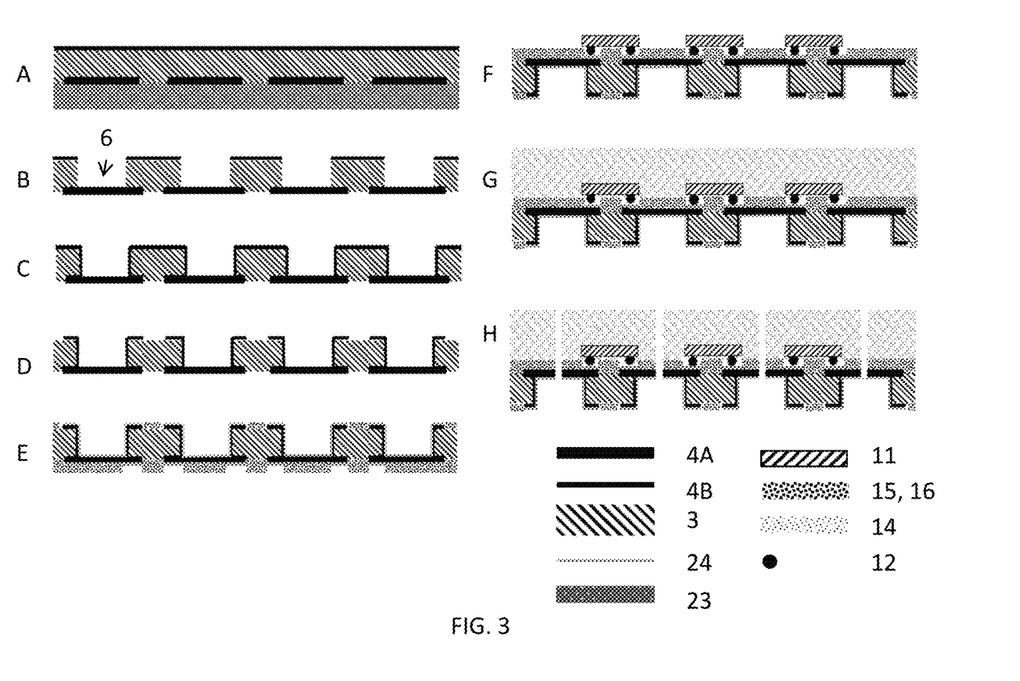
FIG. 3 illustrates a first example of a method for manufacturing a carrier and substrate-based package semiconductor device in accordance with an aspect the present disclosure.

FIG. 3 illustrates a first example of a method for manufacturing a carrier and substrate-based package semiconductor device in accordance with an aspect of the present disclosure. In FIG. 3, various stages of the manufacturing process are indicated using letters A-H. In addition, a table is shown in the bottom right corner indicating a correlation between the color/pattern used in the figure and the corresponding reference signs. A similar table is shown in the bottom right corner of FIG. 4. For convenience, the table below presents the correlation between the reference signs and the components.

Figure 4:
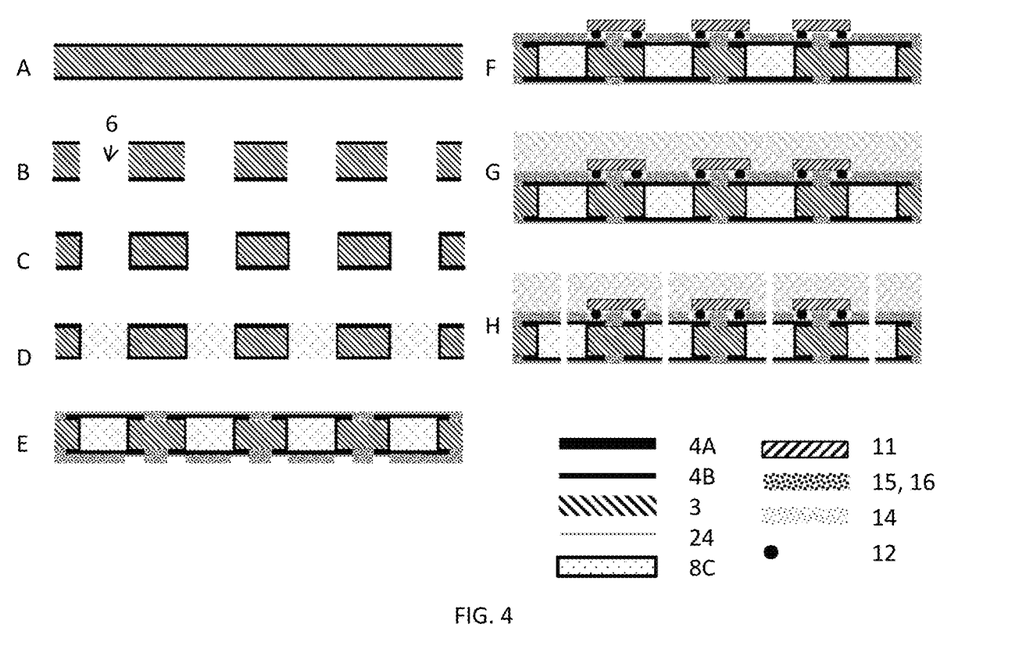
FIG. 4 illustrates a second example of a method for manufacturing a carrier and substrate-based package semiconductor device in accordance with an aspect of the present disclosure.

| Reference sign | Component | Reference sign | Component |
|---|---|---|---|
| 4A | First metal layer | 11 | Semiconductor die |
| 4B | Second metal layer | 12 | Bump, die terminal |
| 3 | Insulating layer | 14 | Molding compound |
| 8C | Solderable material | 15, 16 | Solder mask |
| 23 | Carrier | 24 | ENEPIG |

In FIG. 3, as a first step of the method indicated as stage A, a substrate comprising a single insulating layer 3 is provided that has a Cu layer 4A arranged on a side thereof and a Cu layer 4B arranged on another side thereof. Here, Cu layer 4A is patterned. More in particular, inner terminals have been partially formed using Cu layer 4A. As shown, insulating layer 3 is provided attached to a carrier 23.

Next, the substrate is detached from carrier 23 and cavities 6 are generated by forming slot holes in insulating layer 3. The result thereof is shown as stage B. Next, an electroless or sputtered Cu seed layer is deposited, and a Cu layer is electroplated over the entire substrate. The result thereof is shown as stage C.

Next, a masking layer is arranged over the electroplated Cu layer. This masking layer is patterned, e.g. using lithography techniques, thereby creating openings in the masking layer. Next, the electroplated Cu layer, the underlying seed layer, and the underlying Cu layer are etched through the created openings. After etching, the masking layer is stripped and the situation shown as stage D is obtained.

It should be noted that in FIG. 3, reference sign 4A is used to refer to the original Cu layer, i.e. prior to plating, such as depicted for steps A and B, but also to refer to the layer stack comprising the original Cu layer, the electroless or sputtered Cu seed layer, and the Cu layer electroplated thereon, such as depicted for steps C-H.

Next, a solder mask is applied and patterned. The part of the metal layer that is exposed after patterning the solder mask, is subjected to an electroless plating process, such as an electroless nickel electroless palladium immersion gold plating (ENEPIG) process, resulting in the formation of an ENEPIG layer 24. After this plating, the situation shown as stage E is obtained.

Next, a semiconductor die 11 is flip-chipped on the inner terminals formed by metal layer 4A as shown as stage F.

Thereafter, a molding compound 14 is applied that covers semiconductor 11. This is shown as stage G. As final step, singulation is performed by e.g. blade or laser dicing thereby dividing the carrier into a plurality of substrate-based package semiconductor devices as shown as stage H.

FIG. 4 illustrates a second example of a method for manufacturing a carrier and substrate-based package semiconductor device in accordance with an aspect of the present disclosure.

As a first step shown as stage A, a substrate comprising a single insulating layer 3 is provided which has a first metal layer 4A arranged on a side thereof and a second metal layer 4B arranged on another side thereof. Both metal layers 4A, 4B are not patterned.

Next, shown as stage B, slot holes are formed that extend fully through insulating layer 3 and metal layers 4A, 4B. Next, shown as stage C, a Cu seed layer is electroless plated or deposited and a Cu layer is electroplated.

Next, shown as stage D, the formed slot holes are filled with a conductive solderable material 8C, which is cured after filling. Next, the surface is grinded. After grinding, a Cu layer is electroplated. A masking layer is arranged over the electroplated Cu layer. This masking layer is patterned, e.g. using lithography techniques, thereby creating openings in the masking layer. Next, the electroplated Cu layer is etched through the created openings and the masking layer is removed. Then, a solder mask is applied and patterned. The part of the electroplated Cu layer that is exposed after patterning the solder mask is subjected to an electroless plating process, such an electroless nickel electroless palladium immersion gold plating (ENEPIG) process, resulting in the formation of an ENEPIG layer 24 shown in stage E.

Next, a semiconductor die 11 is flip-chipped on the inner terminals formed by Cu layer 4A shown as stage F. Thereafter, a molding compound 14 is applied that covers semiconductor 11 shown as stage G. As final step, shown as stage H, singulation is performed by e.g. blade or laser dicing thereby dividing the carrier into a plurality of substrate-based package semiconductor devices.

In the above, the present disclosure has been described using detailed embodiments thereof. However, the present disclosure is not limited to these embodiments. Instead, various modifications are possible without departing from the scope of the present disclosure which is defined by the appended claims and their equivalents.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalization thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A carrier comprising a plurality of non-singulated substrate-based package semiconductor devices, comprising:
   a substrate comprising one or more insulating layers and having an upper surface, a lower surface, and a lower metal layer arranged on the lower surface;
   a semiconductor die on which an electric component or circuit is integrated for each substrate-based package semiconductor device, the electronic component or circuit has one or more die terminals, wherein the semiconductor die is mounted on the upper surface of the substrate, and wherein the substrate-based package semiconductor device is configured for being mounted with its lower surface on a further substrate or carrier;
   one or more package terminals is at least partially formed using the lower metal layer for each substrate-based package semiconductor device, the one or more package terminals being electrically connected to the one or more die terminals of the semiconductor die of that substrate-based package semiconductor device;
   wherein the lowest insulating layer among the one or more insulating layers have cavities arranged near and associated with the one or more package terminals of the plurality of non-singulated substrate-based package semiconductor devices;
   an inner wall of the cavities is covered with a conductive body that connects to the respective associated package terminal;
   wherein the non-singulated substrate-based package semiconductor devices are separated by a separating region of the substrate; and
   wherein the cavities are at least partially formed in the separating region.

2. The carrier according to claim 1, wherein each cavity of a given non-singulated substrate-based package semiconductor device forms, together with a cavity of an adjacent non-singulated substrate-based package semiconductor device a contiguous cavity, wherein the carrier is configured to be cut, sawed, punched, or otherwise subjected to a severing action, along a plurality of singulation lines for the purpose of singulating the plurality of non-singulated substrate-based package semiconductor devices; and
   wherein the contiguous cavities have center points that are aligned with the singulation lines.

3. The carrier according to claim 2, wherein each package terminal is associated with a respective cavity, and wherein each cavity is provided with a conductive body that connects to the package terminal that cavity is associated with, wherein the conductive body in a cavity of a given non-singulated substrate-based package semiconductor device forms together with the conductive body in a cavity of an adjacent non-singulated substrate-based package semiconductor device, a contiguous conductive body.

4. The carrier according to claim 2, wherein the cavities extend fully through the lowest insulating layer.

5. The carrier according to claim 2, wherein the conductive bodies comprise one or more metal layers, wherein the conductive bodies further comprise a solderable conductive material arranged on the one or more metal layers, wherein the solderable conductive material is a material chosen from the group consisting of Ag, Bi, Cu, In, Sb, Sn, Pb, Zn, or any combination thereof, and/or the carrier further comprising a body of solidified molding compound covering the upper surface of the substrate and encapsulating the semiconductor dies.

6. The carrier according to claim 2, wherein the substrate comprises a plurality of insulating layers, and wherein the cavities extend through each of the plurality of insulating layers.

7. The carrier according to claim 1, wherein the cavities extend fully through the lowest insulating layer.

8. The carrier according to claim 1, wherein the conductive bodies comprise one or more metal layers, wherein the conductive bodies further comprise a solderable conductive material arranged on the one or more metal layers, wherein the solderable conductive material is a material chosen from the group consisting of Ag, Bi, Cu, In, Sb, Sn, Pb, Zn, or a combination thereof, and/or the carrier further comprises a body of solidified molding compound covering the upper surface of the substrate and encapsulating the semiconductor dies.

9. The carrier according to claim 1, further comprising an upper metal layer arranged on the upper surface of the substrate, the upper metal layer at least partially forming inner terminals that are connected to the die terminals of the plurality of non-singulated substrate-based package semiconductor devices, wherein the inner terminals are electrically connected to the package terminals, through the conductive bodies arranged on the inner walls of the cavities.

10. The carrier according to claim 9, wherein the substrate comprises a plurality of insulating layers and one or more inner metal layers arranged in between adjacent insulating layers, wherein the conductive bodies arranged on the inner walls of the cavities connect to and/or are partially formed by the one or more inner metal layers that are arranged in between the most upper insulating layer of the lowest insulating layer and the insulating layer arranged above the most upper insulating layer, wherein the one or more inner metal layers are electrically connected to the inner terminals using one or more vias through the insulating layers among the one or more insulating layers other than the lowest insulating layer.

11. The carrier according to claim 1, wherein the substrate comprises a plurality of insulating layers, and wherein the cavities extend through each of the plurality of insulating layers.

12. The carrier according to claim 1, wherein the semiconductor dies are flip-chipped on the upper surface, or wherein the semiconductor dies are wire bonded, using bondwires, to the upper surface, or wherein the semiconductor dies are mounted to the upper surface using clip or ribbon bonding, and/or wherein the non-singulated substrate-based package semiconductor devices comprise further package terminals that are at least partially formed using the lower metal layer and that are arranged spaced apart from the cavities.

13. The carrier according to claim 1, further comprising a first solder mask that is arranged on the upper surface and that comprises openings exposing the inner terminals, and/or further comprising a second solder mask that is arranged on the lower surface and that comprises openings exposing the package terminals and the further package terminals when applicable, and/or wherein the one or more insulating layers comprise layers made of a material chosen from the group consisting of fiber-reinforced epoxy/polymer, polyester, polyimide, polytetrafluorethylene, polyamide, liquid crystal polymers, ceramics such as $Al_2O_3$, AlN, BeO, glass, or any combination thereof.

14. The carrier according to claim 1, wherein the non-singulated substrate-based package semiconductor devices are identical.

15. A substrate-based package semiconductor device obtained by singulating the substrate-based package semiconductor devices from the carrier as defined in claim 1, wherein the lowest insulating layer among the one or more insulating layers have cutout regions in side surfaces of the substrate arranged near and associated with the one or more package terminals, the cutout regions corresponding to the cavities having been formed as a result of performing the singulation; and
    an inner wall of the cutout regions is covered with the conductive body that connects to the respective associated package terminal.

16. The substrate-based package semiconductor device according to claim 15, wherein the cavities extend fully through the lowest insulating layer, wherein the substrate-based package semiconductor device has been obtained by performing sawing, punching, cutting, or by performing another severing action, on the carrier along the plurality of singulation lines, and wherein the lowest insulating layer among the one or more insulating layers have cutout regions in side surfaces of the substrate arranged near and associated with the one or more package terminals, the cutout regions corresponding to the cavities having been formed as a result of performing the singulation; and
    an inner wall of the cutout regions is covered with the conductive body that connects to the respective associated package terminal.

17. A method of manufacturing a carrier as defined in claim 1, comprising the steps of:
    providing a substrate comprising one or more insulating layers and having an upper surface, a lower surface, and a lower metal layer arranged on the lower surface, wherein the lower metal layer at least partially forms one or more package terminals;
    forming a plurality of cavities, holes, or recesses at a plurality of singulation lines on the lower surface of the substrate;
    covering an inner wall of formed cavities with a conductive body that connects to the one or more package terminals;
    arranging a semiconductor die on which an electric component or circuit is integrated on the upper surface of the substrate, the electronic component or circuit having one or more die terminals that are connected to the package terminals;
    performing sawing, punching, cutting, or by performing another severing action for singulating the substrate-based package semiconductor devices by separating the substrate-based package semiconductor devices in accordance with the singulation lines.

18. A substrate-based package semiconductor device, comprising:
    a substrate comprising one or more insulating layers and having an upper surface, a lower surface, a plurality of side surfaces, and a lower metal layer arranged on the lower surface, wherein the substrate-based package semiconductor device is configured for being mounted with its lower surface on a further substrate or carrier;
    one or more semiconductor dies on which an electric component or circuit is integrated, the electronic component or circuit having one or more die terminals, and the semiconductor die being mounted on the upper surface of the substrate;

one or more package terminals at least partially formed using the lower metal layer, the one or more package terminals being electrically connected to the one or more die terminals;

wherein the lowest insulating layers among the one or more insulating layers have cutout regions in the side surfaces arranged near and associated with the one or more package terminals; and an inner wall of the cutout regions is covered with a conductive body that connects to the respective associated package terminal.

* * * * *